(12) United States Patent
Ueda et al.

(10) Patent No.: US 12,392,038 B2
(45) Date of Patent: Aug. 19, 2025

(54) THIN-FILM DEPOSITION METHOD AND SYSTEM

(71) Applicant: ASM IP Holding B.V., Almere (NL)

(72) Inventors: Shinya Ueda, Kai (JP); SeokJae Oh, Suwon-si (KR); HyunGyu Jang, Osan-si (KR); HeeSung Kang, Anyang-si (KR); WanGyu Lim, Hwaseong-si (KR); HyounMo Choi, Hwaseong-si (KR); YoungJae Kim, Cheonan-si (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/979,237

(22) Filed: Nov. 2, 2022

(65) Prior Publication Data

US 2023/0142899 A1    May 11, 2023

Related U.S. Application Data

(60) Provisional application No. 63/276,335, filed on Nov. 5, 2021.

(51) Int. Cl.
| | |
|---|---|
| *C23C 16/505* | (2006.01) |
| *C23C 16/34* | (2006.01) |
| *C23C 16/455* | (2006.01) |
| *C23C 16/52* | (2006.01) |
| *C23C 16/56* | (2006.01) |
| *H01J 37/32* | (2006.01) |

(52) U.S. Cl.
CPC .......... *C23C 16/505* (2013.01); *C23C 16/345* (2013.01); *C23C 16/45536* (2013.01); *C23C 16/4554* (2013.01); *C23C 16/52* (2013.01); *C23C 16/56* (2013.01); *H01J 37/32449* (2013.01); *H01J 37/32743* (2013.01); *H01J 2237/3321* (2013.01)

(58) Field of Classification Search
None
See application file for complete search history.

(56) References Cited

U.S. PATENT DOCUMENTS

| | | | |
|---|---|---|---|
| 5,272,014 A | * | 12/1993 | Leyendecker .......... C23C 14/32 427/574 |
| 9,576,792 B2 | | 2/2017 | Chen |
| 10,262,854 B2 | | 4/2019 | Chen |
| 10,580,645 B2 | | 3/2020 | Ueda |

(Continued)

FOREIGN PATENT DOCUMENTS

JP    2014179607 A    9/2014

OTHER PUBLICATIONS

Hassouba et al. Numerical Calculations of Some Plasma Parameters of the Capacitively Coupled RF Discharge. Journal of Modern Physics, 2014, 5, 591-598 (Year: 2014).*

*Primary Examiner* — Jose I Hernandez-Kenney
(74) *Attorney, Agent, or Firm* — Snell & Wilmer L.L.P.

(57) ABSTRACT

A method and system for forming a film on a substrate are disclosed. Exemplary methods include using a first plasma condition to form a layer of deposited material having a good film thickness uniformity, using a second plasma condition to treat the deposited material and thereby form treated material, and using a third plasma condition to form a surface-modified layer—e.g., reactive sites on the treated material.

21 Claims, 9 Drawing Sheets

(56) References Cited

U.S. PATENT DOCUMENTS

| | | | |
|---|---|---|---|
| 2016/0079054 A1* | 3/2016 | Chen | C23C 16/345 |
| | | | 438/762 |
| 2016/0196980 A1* | 7/2016 | Degai | H01L 29/458 |
| | | | 438/597 |
| 2018/0130701 A1* | 5/2018 | Chun | H10B 41/27 |

* cited by examiner

| RF power | RF step configuration | Film thickness map | Model |
|---|---|---|---|
| Low first RF power in step t3 | Step 3 : Step 4 : Step 5 | Non-uniformity% = 2.05% | (i) low RF power doesn't impact N₂ and has low damage on thin film |
| High first RF power in step t3 | Step 3 : Step 4 : Step 5 | Non-uniformity% = 11.64% | N₂⁺ atomic collision cascade; H₂ implantation → blister |

FIG. 6

THIN-FILM DEPOSITION METHOD AND SYSTEM

CROSS-REFERENCE TO RELATED APPLICATIONS

This application claims priority to U.S. Provisional Patent Application Ser. No. 63/276,335 filed Nov. 5, 2021 titled THIN-FILM DEPOSITION METHOD AND SYSTEM, the disclosure of which is hereby incorporated by reference in its entirety.

FIELD OF INVENTION

The present disclosure generally relates to methods and systems suitable for the formation of devices. More particularly, the disclosure relates to methods for depositing material on a surface of a substrate, to systems for depositing the material, and to structures including the deposited material.

BACKGROUND OF THE DISCLOSURE

During the formation of devices, such as semiconductor devices, it is often desirable to form patterned features on a surface of a substrate. Further, it may be desirable to conformally and uniformly deposit a material overlying the patterned features.

Techniques to deposit various material layers can employ relatively high temperatures (e.g., temperatures higher than 600° C.). For many applications, it may be desirable to deposit a material at a lower temperature.

Plasma-enhanced deposition techniques, such as plasma-enhanced atomic layer deposition or the like, can be used to deposit a material at lower substrate temperatures. However, use of plasmas to deposit materials can result in other challenges, such as increased non-uniformity of the deposited material and blister and/or void formation within the deposited material. For example, a thickness and/or composition non-uniformity of a plasma-deposited material may be relatively high, compared to the material deposited at a higher temperature—without the aid of a plasma or other excitation source. Additionally or alternatively, a (e.g., thickness or composition) conformality of plasma-deposited material can be relatively low, compared to the material deposited using non-plasma-assisted processes.

One of the reasons for the relatively high non-uniformity of plasma-deposited material can be attributed to RF power used to form a plasma. When the RF power is too high or too low, the film uniformity can decrease. For example, too low of RF power can cause incomplete reactions on a substrate surface and too high of RF power causes higher electric field at edge of the substrate. In both cases, non-uniform chemical reactions between a gas and a substrate can occur, especially at an edge region of a substrate.

Further, as illustrated in FIG. 1, when a gap between electrodes used to form a plasma, e.g., a showerhead and a susceptor on which a substrate is loaded, becomes narrower, an electric field at edge of the wafer generally becomes higher. That is, a relatively narrow gap generally results in higher electric field between electrodes and this becomes increasingly problematic as the applied RF power to the electrodes is increased. FIG. 1 illustrates an electric field in relation to a radial position on a substrate, as measured from a center of the substrate, for a gap distance of 6 mm (102), 7.5 mm (104), 9 mm (106), and 12 mm (108).

The high electric fields can cause blisters and other defects in deposited material layers. FIG. 2 illustrates a deposited material film 202 that includes blisters 204 and a void 206 that can result during plasma-enhanced deposition of material layers. Blisters 204 and/or void 206 may be caused by hydrogen gas or other residual reactant and/or byproduct gas derived from precursors and/or reactants used to form the deposited material. Blisters may cause voids and/or become defective portions of a device, such as a PRAM (phase-change random access memory), a VNAND (vertical NAND (e.g., flash memory)) device, or the like.

Accordingly, improved plasma-assisted deposition methods and systems are desired. Further, methods and systems for forming deposited material with relatively low non-uniformity are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to methods for depositing a film using plasma-assisted processes. Examples of the disclosure further relate to methods and systems for conformally and/or uniformly depositing the film. While the ways in which various embodiments of the present disclosure address drawbacks of prior methods and systems are discussed in more detail below, in general, embodiments of the disclosure provide improved methods that include a plurality of plasma conditions to improve (i.e., decrease) non-uniformity and/or reduce blisters and voids within a film and/or increase conformality of deposited material.

In accordance with exemplary embodiments of the disclosure, a method of forming a film on a substrate is provided. The method can be used to form conformal material overlying a gap on a surface of a substrate and/or uniform material overlying a surface of the substrate. In accordance with various examples, the method includes loading a substrate within a reaction chamber of a reactor, providing a first gas within the reaction chamber for a first gas pulse period, providing a second gas within the reaction chamber, using a first plasma condition, forming first activated species using the second gas to thereby form a layer of deposited material, using a second plasma condition, forming second activated species using the second gas to thereby form a treated layer, and using a third plasma condition, forming activated species using a third gas to thereby form a surface-modified layer. In accordance with various examples of these embodiments, the first plasma condition and the second plasma condition differ. In accordance with further examples, the first plasma condition is carried out at a first plasma power, the second plasma condition is carried out at a second plasma power, and the second plasma power is greater than the first plasma power. In accordance with further examples, the third plasma condition is carried out at a third plasma power, and the third plasma power is less than the second plasma power and/or the third plasma power is greater than the first plasma power. In accordance with further examples, the second plasma condition increases a hardness and/or decreases a wet etch rate of the layer of deposited material. In other words, the second plasma may densify the deposited material. The third plasma condition can create film-forming promotion sites on the treated layer—e.g., for subsequent cycles of the method and/or for deposition of a subsequent layer of material. In accordance with yet further examples, the first gas comprises a silicon-containing precursor, such as, for example, a silane, an amine, and/or a silicon-containing precursor comprising a halogen. In accordance with further examples, the second gas comprises a nitrogen-containing reactant, such as, for example, one or more of $N_2$, $NH_3$, $N_2O$ and $NO_2$, in any combination. In accordance with additional examples, the third gas comprises a hydrogen-containing reactant, such as, for example, Hz, or the like. The method can be used to form, for example, a layer or film comprising silicon nitride. The steps of using the first plasma condition, using the second plasma condition, and using the third plasma condition can be repeated to form the film.

In accordance with additional embodiments of the disclosure, a structure includes a substrate and a film as described herein.

In accordance with further examples of the disclosure, a system is provided. The system can be configured to perform a method as described herein and/or to form a structure as described herein. The system can include a reactor, comprising a reaction chamber and an electrode, and a controller configured to provide a first plasma power to the electrode during a deposition step, provide a second plasma power during a treatment step, and provide a third plasma power during a surface modification step.

These and other embodiments will become readily apparent to those skilled in the art from the following detailed description of certain embodiments having reference to the attached figures; the invention not necessarily being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 6 illustrates a relationship between plasma power during various steps and thickness non-uniformity. FIG. 6 further illustrates possible reaction models.

Figure 1:
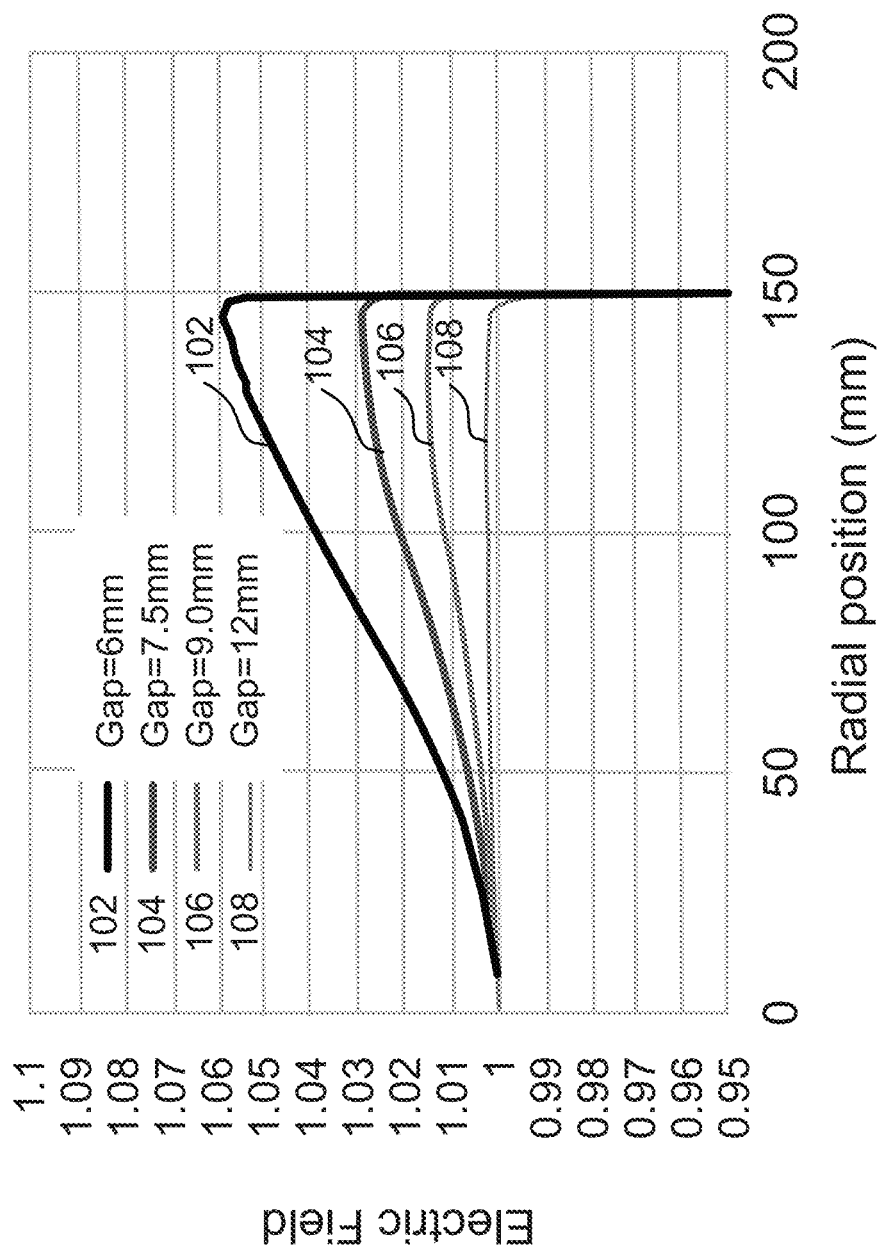
FIG. 1 illustrates a relationship between gap distance, radial position, and an electric field.
Figure 2:
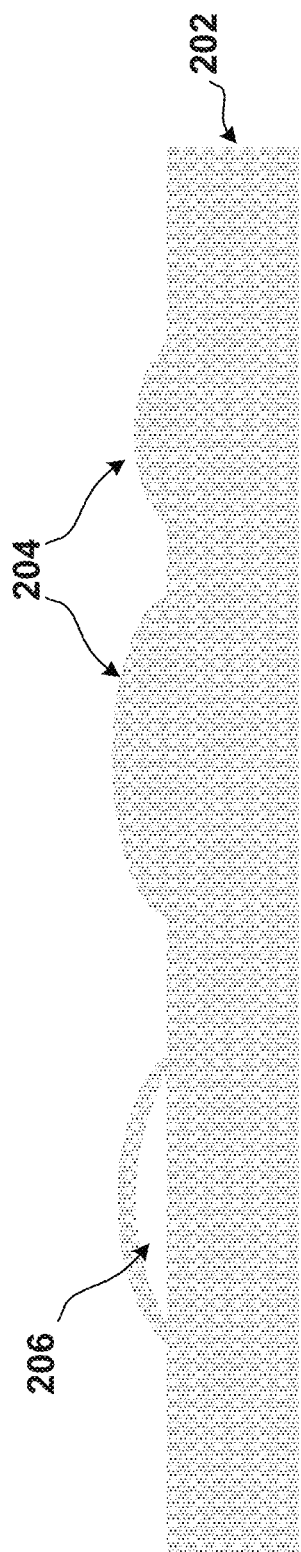
FIG. 2 illustrates a film including a blister and a void.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming a film on a substrate, structures formed using the methods, and systems that can be used to perform the methods and/or form the films. As described in more detail below, methods described herein can be used to form films with relatively low non-uniformity, that are relatively conformal, and that exhibit relatively uniform wet etch rates—even on sidewalls of gaps. Exemplary methods can be used to form films and structures suitable for forming electronic devices, such as PRAM, VNAND, and/or other structures and/or devices. For example, methods described herein can be used for gap fill process for DRAM or VNAND devices, liner process for TSV (through silicon via) applications, and encapsulation layer process for PRAM devices. Unless otherwise noted, examples of the disclosure are not necessarily limited to such applications.

In this disclosure, gas may include material that is a gas at normal temperature and pressure, a vaporized solid and/or a vaporized liquid, and may be constituted by a single gas or a mixture of gases, depending on the context. A gas other than the process gas, e.g., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent, a gas that can excite a precursor when plasma power is applied, a gas that may be used to treat (e.g., densify) a material, and/or a gas that can provide desired surface termination. When used to excite a precursor, an inert gas can be considered a reactant. In some cases, the terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various structures, such as recesses, vias, lines, and the like formed within or on at least a portion of a layer of the substrate.

In this disclosure, a recess between adjacent protruding structures and any other recess pattern may be referred to as a "gap." That is, a gap may refer to any recess pattern, including a hole/via, region between lines, and the like. A gap can have, in some embodiments, a width of about 20 nm to about 100 nm, and typically about 30 nm to about 50 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a gap has an aspect ratio of about 2 to about 10, and typically of about 2 to about 5. The dimensions of the gap may vary depending on process conditions, film composition, intended application, and the like.

As used herein, the term cyclic or cyclical deposition may refer to the sequential introduction of precursors/reactants into a reaction chamber to deposit a layer over a substrate and includes processing techniques such as atomic layer deposition (e.g., plasma-enhanced atomic layer deposition) and the like.

As used herein, the term atomic layer deposition (ALD) may refer to a vapor deposition process in which deposition cycles, typically a plurality of consecutive deposition cycles, are conducted in a process chamber. Generally, during each cycle, a precursor is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). A reactant may subsequently or concurrently be introduced into the process chamber for use in converting the chemisorbed precursor to the desired material on the deposition surface. The reactant can be capable of further reaction with the precursor (e.g., when activated using a plasma). Further, purging steps can also be utilized during and/or between cycles to remove excess precursor from the process chamber and/or remove excess reactant and/or reaction byproducts from the process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with pulses of precursor(s)/reactive gas(es), and purge (e.g., inert) gas(es).

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequences, and/or functions or purposes of the adjacent films or layers. The terms film and layer can be used interchangeably.

In this disclosure, continuously can refer to one or more of without breaking a vacuum, without interruption as a timeline, without any material intervening step, without changing treatment conditions, immediately thereafter, as a next step, or without an intervening discrete physical or chemical structure or layer between two structures or layers in some embodiments. For example, a reactant and/or an inert or noble gas can be supplied continuously during two or more steps and/or cycles of a method.

As used herein, the term purge may refer to a procedure in which an inert or substantially inert gas (i.e., a gas that does not take part in a chemical reaction to an appreciable extent) is provided to a reaction chamber between pulses of other (e.g., reactant or precursor) gases. For example, a purge may be provided between a step of providing a precursor to a reaction chamber and a step of providing plasma power. For example, in the case of temporal purges, a purge step can be used, e.g., in the temporal sequence of providing a precursor to a reaction chamber, ceasing the flow of the precursor, and providing a purge gas to the reaction chamber, wherein the substrate on which a layer is deposited may not move. In the case of spatial purges, a purge step can take the form of moving a substrate from a first location to which a first precursor is supplied, through a purge gas curtain, to a second location to which a treatment gas is supplied.

As used herein, silicon nitride refers to a material that includes silicon and nitrogen. Silicon nitride can be represented by the formula $Si_3N_4$. In some cases, the silicon nitride may not include stoichiometric silicon nitride. In some cases, the silicon nitride can include other elements, such as carbon, hydrogen, or the like.

In some cases, a conformal layer exhibits a step coverage equal to or greater than 50%, or greater than 80%, or greater than 90%, or greater than 100%, or greater than 110%, or greater than 150%, or between 50% and 150% or between 80% and 100% in/on structures having aspect ratios (height/width) of more than about 2, more than about 5, more than about 10, more than about 25, more than about 50, more than about 100, or between about 10 and 100, or about 2 and 10, or about 5 and 25. It shall be understood that the term "step coverage" refers to a thickness of a layer on a distal surface of a recess, divided by the thickness of that layer on a proximal surface of the recess, and is expressed as a percentage. It shall also be understood that a distal portion of the gap feature refers to a portion of the gap feature that is relatively far removed from a substrate's surface, and that the proximal portion of a gap feature refers to a part of the gap feature which is closer to the substrate's surface compared to the distal/lower/deeper portion of the gap feature.

As used herein, the term overlap can mean coinciding with respect to time and within a reaction chamber. For example, with regard to gas pulse periods or steps, such as precursor pulse periods and a step of providing a reactant, two or more gas pulse periods and/or steps can overlap when gases from the respective pulse periods or steps are within the reaction chamber or provided to the reaction chamber for a period of time.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like, in some embodiments. Further, in this disclosure, the terms "including," "constituted by" and "having" can refer independently to "typically or broadly comprising," "comprising," "consisting essentially of," or "consisting of" in some embodiments. In accordance with aspects of the disclosure, any defined meanings of terms do not necessarily exclude ordinary and customary meanings of the terms.

Figure 3:
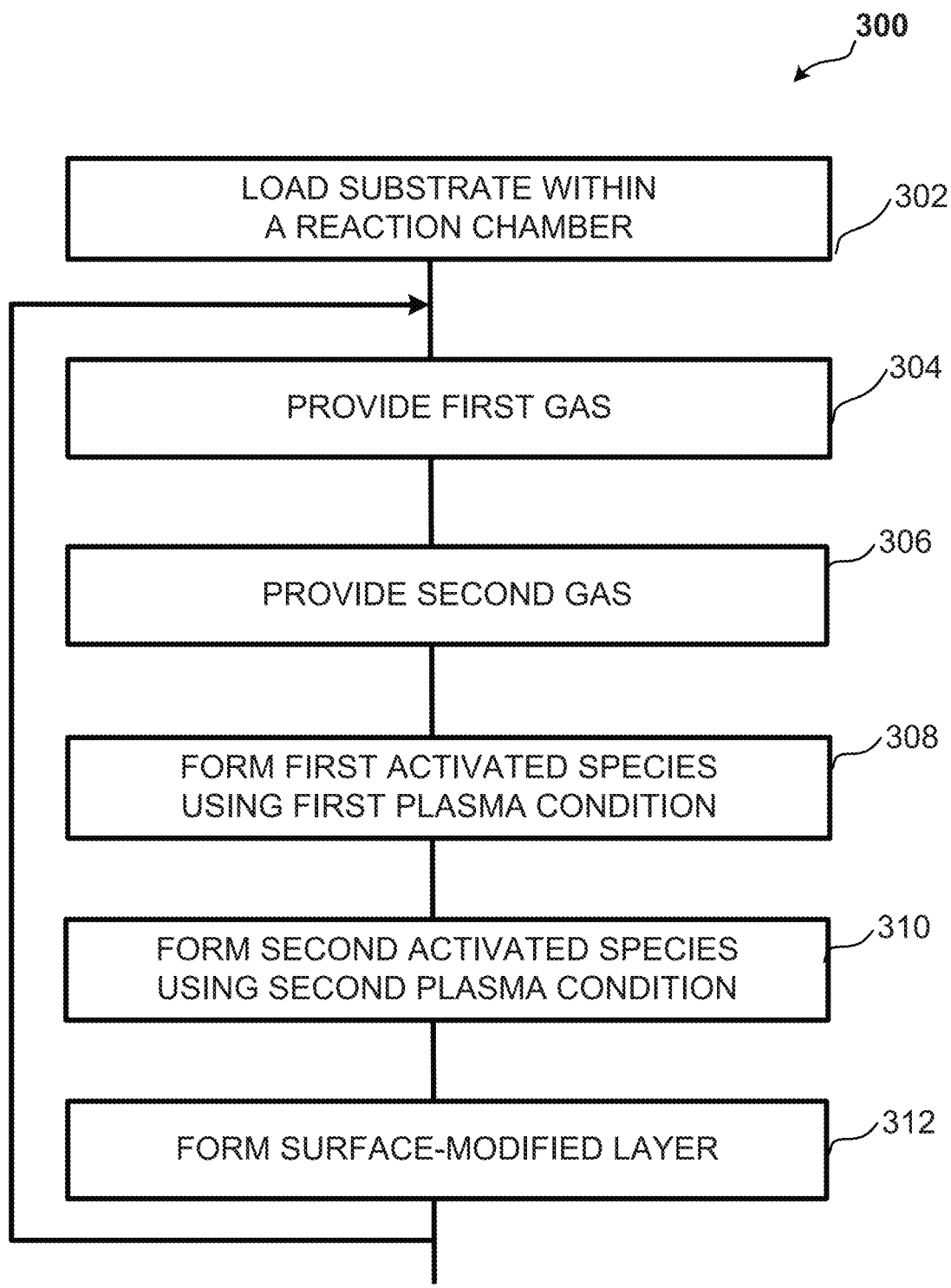
FIG. 3 illustrates a method in accordance with examples of the disclosure.

Referring again to the figures, FIG. 3 illustrates a method 300 of forming a film on a substrate in accordance with examples of the disclosure. Method 300 can be used to form the conformal films overlying a gap on a surface of a substrate and/or to form films with relatively low non-uniformity across a surface of a substrate.

Figure 4:
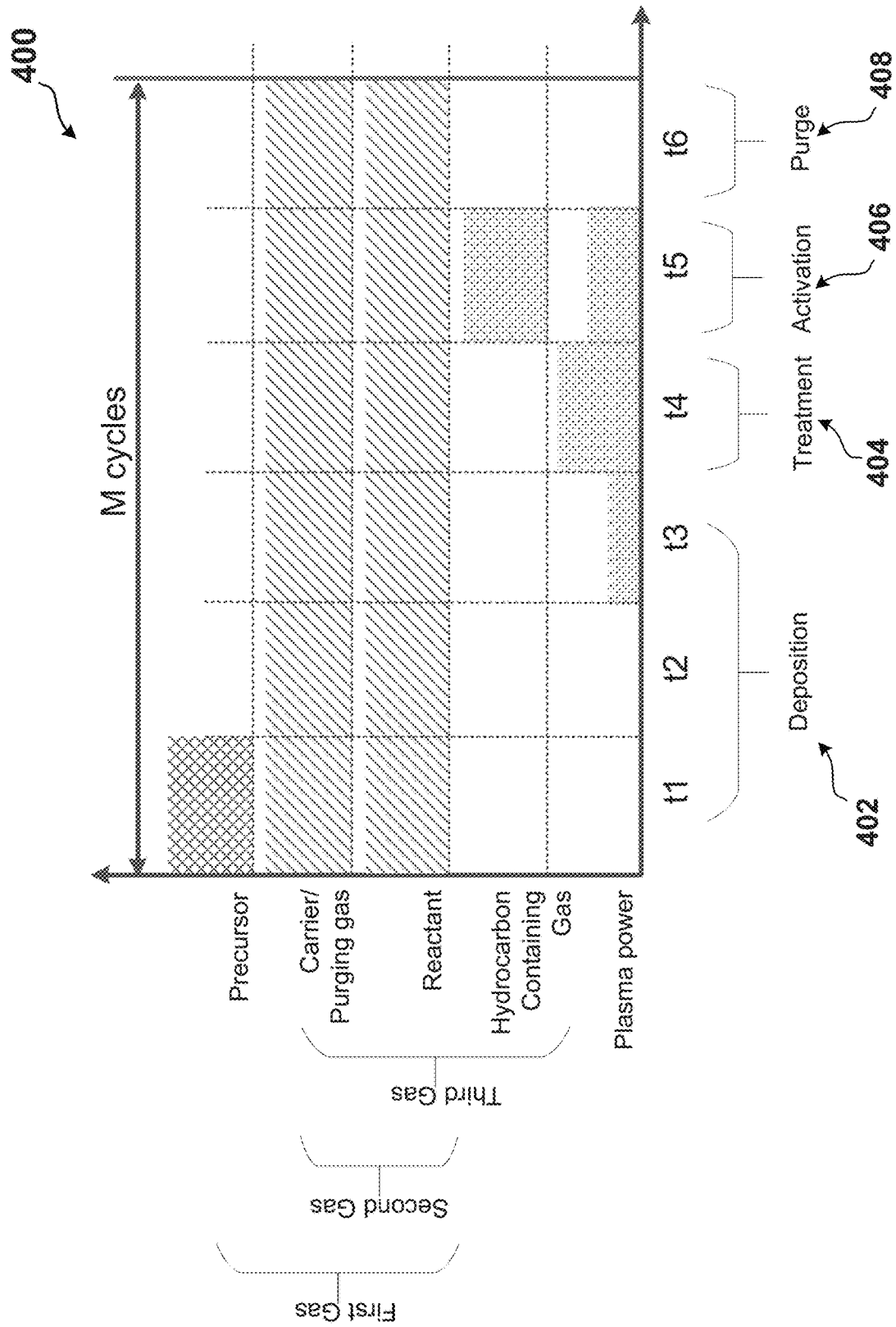
FIG. 4 illustrates a timing sequence in accordance with examples of the disclosure.

As illustrated, method 300 includes the steps of loading a substrate within a reaction chamber of a reactor (step 302), providing a first gas within the reaction chamber (step 304), providing a second gas within the reaction chamber (step 306), using a first plasma condition, forming first activated species using the second gas (step 308), using a second plasma condition, forming second activated species using the second gas (step 310), and forming a surface-modified layer (step 312). FIG. 4 illustrates a timing sequence 400 suitable for use with method 300.

During step 302, the substrate comprising the gap is provided within a reaction chamber of a reactor of a reactor system. In accordance with examples of the disclosure, the reaction chamber can form part of a cyclical deposition reactor, such as a cyclical chemical vapor deposition reactor, and particularly a plasma-enhanced CVD reactor. Various steps of method 300 can be performed within a single reaction chamber or can be performed in multiple reaction chambers, such as reaction chambers of a cluster tool or a process module. In more detail, the substrate may be loaded onto a susceptor within the reactor. The susceptor may be mounted on a heating block to supply a heat energy to the substrate. Lift pins may be provided through through-holes formed in the heating block and the susceptor to accept the substrate. The substrate may include a complex structure formed thereon. For instance, the substrate may include a gap structure or 3D structure for VNAND device application. Exemplary substrates and structures are described in more detail below in connection with FIG. 7.

During step 302, the substrate can be brought to a desired temperature and pressure for steps 304-312. By way of examples, a temperature (e.g., of a substrate or a substrate support) within a reaction chamber can be less than 550° C., less than 500° C., less than 450° C., and/or between about 50° C. and about 550° C. or about 100° C. and about 500° C. A pressure within the reaction chamber can be about 2 to about 40 Torr or about 10 to about 30 Torr.

During step 304, a first gas is provided within the reaction chamber for a first gas pulse period. The first gas can form a chemisorbed layer on the substrate. In accordance with examples of the disclosure, the first gas is or comprises a precursor, such as a silicon-containing gas. In this case, a silicon-containing layer may be formed on the substrate.

Exemplary silicon-containing gases or precursors suitable for use during step 304 include silanes, halogen compounds including silicon and a halogen (e.g., a halogenated (e.g., including one or more of F, Cl, Br, or I) silane), and amines, including silicon and amine functional groups. Particular examples of silicon-containing precursors suitable for use with method 300 include at least one of trisilylamine ($SiH_3$)$_3N$); disilane ($SiH_3$)$_2$); disilylmethylamine (($SiH_3$)$_2$NMe); disilylethylamine (($SiH_3$)$_2$Net); disilylisopropylamine (($SiH_3$)$_2$N (iPr)); disilyl-tert-butylamine (($SiH_3$)$_2$N (tBu)); diethylsilylamine ($SiH_3NEt_2$); di-tert-butylsilylamine ($SiH_3N$ (tBu)$_2$); bis-diethylamino-silane ($SiH_2$ ($NEt_2$)$_2$); bis-dimethylamino-silane ($SiH_2$ ($NMe_2$)$_2$); bis-tertiarybutylamino-silane ($SiH_2$ ($NHtBu$)$_2$); tetraethylorthosilicate (Si (OEt)$_4$); silicon tetrachloride ($SiCl_4$); hexachlorodisilane ($Si_2Cl_6$); dichlorosilane ($SiH_2Cl_2$); tris-dimethylamino-silane ($SiH(N(Me)_2)_3$); bis-ethylmethylamino-silane ($SiH_2[N(Et)(Me)]_2$); hexakis-ethylamino-disilane ($Si_2$ (NHEt)$_6$); tetrakis-ethylamino-silane (Si(NHEt)$_4$); trisilane ($Si_3H_8$); triiodosilane ($SiHI_3$); and diiodosilane ($SiH_2I_2$) or any combination thereof, wherein Me represents a methyl group, Et represents an ethyl group, iPr represents an isopropyl group, and tBu represents a tert-butyl group.

A flowrate of the carrier gas of the precursor can be between about 500 and about 2000 sccm or between about 1000 and about 1500 sccm. The precursor vapor may be carried by the carrier gas to the substrate positioned on the reaction space of the reactor. For example, the precursor may be stored in a bubbling-type source vessel with inlet tube and outlet tube through which the carrier gas is provided to the source vessel and provided from the source vessel to the reaction space with the precursor vapor carried thereon. A duration of step 304 can be between about 0.5 and about 3 seconds or between about 0.5 and about 1.2 seconds. The first gas can include a (e.g., silicon-containing) precursor and optionally a carrier gas, such as nitrogen ($N_2$), argon (Ar), or the like. The carrier can also be used as a purge gas. As illustrated in FIG. 4, in some cases, the first gas includes a precursor, a carrier and/or purge gas, and a reactant.

During step 306, a second gas is provided within the reaction chamber. The second gas can include one or more of a carrier, purge, or inert gas and a reactant. By way of examples, the second gas can include a carrier gas that is used during step 304 and a (e.g., nitrogen-containing) reactant.

Exemplary nitrogen-containing reactants include one or more of $N_2$, $NH_3$, $N_2O$ and $NO_2$, alone or in any combination. In some cases, the nitrogen-containing gas comprises the same compound as the carrier, purge, or inert gas.

A flowrate of the carrier, purge, or inert gas can be between about 500 and about 2000 sccm or between about 1000 and about 1500 sccm. A flowrate of the reactant can be between about 1000 and about 10000 sccm or between about 3000 and about 8000 sccm. The second gas can be provided continuously through one or more (e.g., each) step of a cycle and/or through one or more deposition cycles.

During step 308, using a first plasma condition, a first activated species are formed using the second gas to thereby form a layer of deposited material. The first activated species can react with the chemisorbed layer formed during step 304. For instance, the second gas may be nitrogen-containing gas and the first activated species may react with a chemisorbed layer comprising silicon to form a layer of deposited silicon nitride.

The first plasma condition may be set to form a relatively low electric field at an edge region of the substrate, so that a film thickness uniformity may be improved over the substrate—compared to conventional techniques. For example, the first plasma condition can exhibit a reduced electric field at an edge of a substrate relative to an electric field formed at the edge using the second plasma condition.

During step 310, using a second plasma condition, a second activated species using the second gas is formed to thereby form a treated layer on the substrate. The second activated species are formed using the same (second) gas used to form the first activated species. However, the first plasma condition and the second plasma condition differ. For example, the first plasma power and/or electrode spacing can differ. In more detail, the intensity of the second plasma may be higher than the intensity of the first plasma.

Step 310 can be carried out to control a film quality. In this step, the second plasma condition may be set to improve a film quality, such as a wet etch rate, and may vary depending on the desired film qualities. Exemplary plasma power values and times are provided below in Table 3.

During step 312, using a third plasma condition, activated species using a third gas are formed to thereby form a surface-modified layer. During this step, a third gas may be provided to form film-forming promoting sites on the film formed during step 310. For instance, the third gas may comprise a hydrogen-containing reactant. More specifically, the third gas may be or include hydrogen ($H_2$). In some cases, the third gas includes the carrier, purge, or inert gas and the nitrogen reactant as described above, in addition to the hydrogen-containing reactant.

The third plasma condition may be set to uniformly form film-promoting sites over the substrate. The third plasma condition (e.g., power) in this step may be different from the first plasma condition (e.g., power) and/or the second plasma condition (e.g., power). In more detail, the intensity of the third plasma may be lower than the second plasma and higher than the first plasma. The film-forming promoting sites may contribute to promoting the formation of the layer at the next cycle step and/or another layer.

As illustrated in FIG. 3, steps 304-312 can represent a cycle and can be repeated a number of times to form a film having desired properties and thickness.

Timing sequence 400, illustrated in FIG. 4, illustrates an exemplary sequence for method 300. Sequence 400 includes a deposition step 402, a treatment step 404, an activation step 406, and a purge 408.

Deposition step 402 includes periods t1, t2, and t3. In the illustrated example, during period t1, the first gas and the second gas are provided to the reaction chamber. During period t2, the flow of the precursor is stopped, and the second gas continues to flow, which allows the reaction chamber to be purged. During period t3, while the second gas continues to flow, a plasma power is applied across one or more electrodes to form first activated species using the second gas to thereby form a layer of deposited material.

As noted above, high plasma power may increase an electric field in the edge region of a substrate and deleteriously affect a film uniformity. Therefore, an intensity of the first plasma power provided in this step may be set to not increase an electric field in the edge region of a substrate, but enough to promote uniform chemical reaction over the substrate. For instance, the RF power may be lower than 800 W and higher than 100 W (e.g., for a 300 mm-sized substrate in diameter). The first plasma power provided in this step also may prevent or mitigate formation of blisters caused by residual hydrogen from a first gas (e.g., silicon precursor) or hydrogen gas provided in step t5 when the unit process flow of FIG. 4 cyclically repeats.

Treatment step 404 includes period t4. During t4, a second plasma condition is provided to form second activated species using the second gas to thereby form a treated layer. As noted above, the first plasma condition and the second plasma condition can differ. Specifically, as illustrated, the first plasma condition can be carried out at a first plasma power, and the second plasma condition can be carried out at a second plasma power.

In this step, the second plasma condition (e.g., power) may control a film quality, e.g., a film wet etch rate. For instance, the second plasma power may be greater than the first plasma power and the film wet etch rate may be lowered. That is, the film may be hardened or densified. In one embodiment, the second plasma power may be lower than 1,500 W and higher than 600 W. Even though the second plasma power is relatively high in this step, a film formation step, e.g. silicon nitride film formation step, is already completed by the first plasma power in step t3; thus, a film thickness uniformity may not be affected by the second plasma power. In this step t4, the reactant may be continuously provided and activated by the second plasma power. But the activated reactant supplied in this step t4 may not contribute to the film formation as the film formation is already carried out in step t3 and a surface reaction may no longer continue in step t4. In one embodiment, nitrogen ($N_2$) as a reactant is continuously provided in step t4 and activated nitrogen contributes to a silicon nitride film densification, increase of Si—N bonds, and removal of hydrogen (which the silicon precursor may contain) from the film. In more detail, nitrogen ions, such as $N^+$ and $N^{2+}$ activated by the second plasma power, can break the Si—Si bond, increase a number of Si—N bonds and result in silicon nitride film densification. The nitrogen radicals and ions. such as $N^+$ and $N^{2+}$, also react with N—H bonds and Si—H bonds formed on the surface, remove hydrogen (—H) from the bonding structures and form Si—N bonding structures, increasing Si—N bonding structures. However, in another embodiment, the activated reactant supplied in this step may contribute to additional formation of a film as it may contain nitrogen elements.

Activation step 406 includes period t5. During period t5, hydrogen-containing gas may be provided and activated by a third plasma power. The dissociated hydrogen gas may form hydrogen-terminated sites on the film and may act as film-forming promoting sites or bonding sites for a precursor (e.g., silicon-containing), which is provided at the next cycle and reduce inactive sites on the substrate. Thus, this step may contribute to improving a film growth rate and a step coverage on a complex structure, such as a gap or 3D structure (e.g., having an aspect ratio as noted herein) formed on a substrate. In this step, a purge gas may be provided and activated together with the third gas. But activated purge gas may destroy the hydrogen terminated sites, so the intensity of plasma power provided in this step may be set to be low, but enough to form and keep hydrogen terminated sites. More specifically, the intensity of plasma power may be lower than the second plasma power, but (and/or) higher than the first plasma power. The hydrogen-containing gas may be at least one of $H_2$, H atom, and $NH_3$ or a combination thereof. The second gas can be continuously provided during period t5 and can contribute to stabilization of process pressure during a process.

Purge 408 includes period t6. During period t6, residual gas may be purged from the reaction chamber by a purge gas, such as Ar or $N_2$ (e.g., the second gas). The periods t1 to t6 may be repeated (m cycles) until the desired film thickness is achieved.

Figure 5:
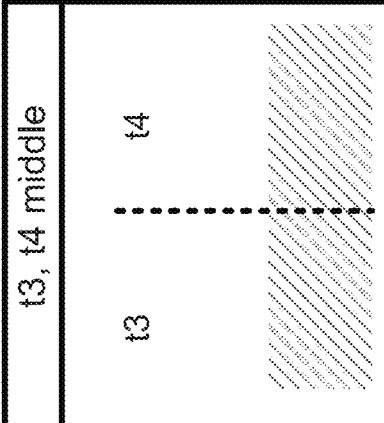
FIG. 5 illustrates a relationship between thickness non-uniformity and plasma power.

FIG. 5 illustrates film thickness uniformity according to the intensity of plasma power in period t3 and period t4 of FIG. 4. Specifically, in FIG. 5, the silicon nitride film thickness uniformity is better (non-uniformity percent is lower) when the first plasma power is relatively low and the second plasma power is relatively high, compared to other plasma power levels.

FIG. 6 illustrates an effect of plasma power applied during period t3 and plasma power applied during period t5 of FIG. 4. Plasma power is illustrated as RF power, but could be other frequencies as noted herein. As shown in FIG. 6, when the first plasma power is relatively low, a film (e.g., silicon nitride) is less damaged by nitrogen ion bombardment and thus less hydrogen elements are thought to penetrate into the film during period t5, and therefore blisters are not generated and more hydrogen-terminated sites may be formed and preserved. But when the plasma power is relatively high, a silicon nitride film is increasingly damaged by nitrogen ion bombardment and it is thought that more hydrogen elements penetrate into the film during period t5 and thus blisters are generated and less hydrogen-terminated sites may be formed. Thus, low intensity of first plasma power can have an effect of preventing blisters from being generated during method 300 and contribute to forming and preserving more hydrogen-terminated sites.

Figure 7:
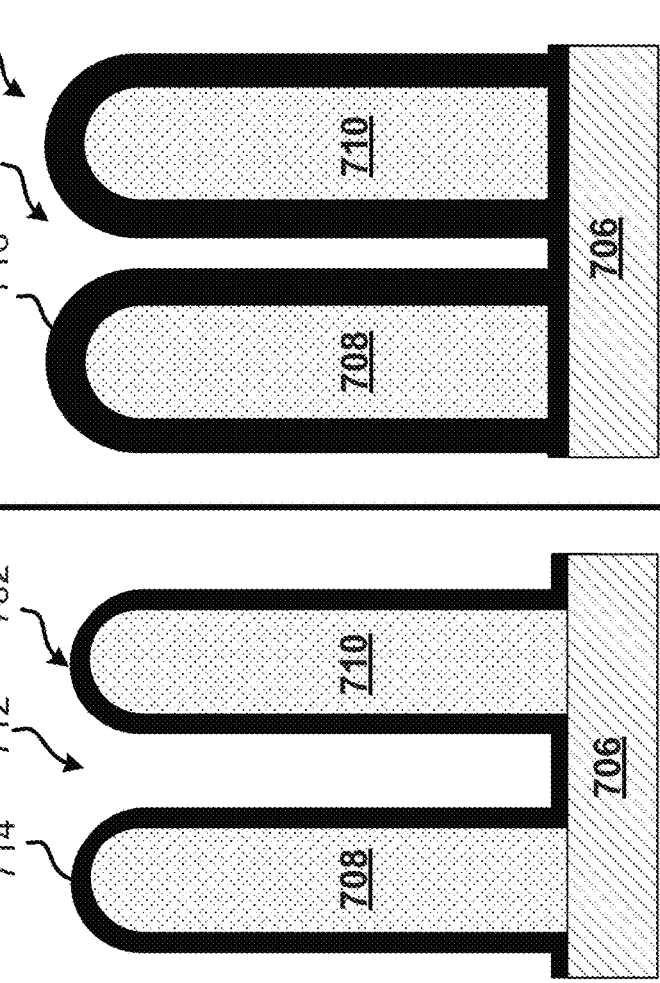
FIG. 7 illustrates an effect of hydrogen-containing gas to a film growth rate and step coverage of films in accordance with examples of the disclosure.

FIG. 7 illustrates structures 702 and 704 and illustrates an effect of hydrogen-containing gas to a film growth rate and a step coverage. Structures 702 and 704 each include a substrate 706, features 708, 710, and a gap 712 formed therebetween. Structure 702 includes a conformally formed silicon nitride layer 714 overlying features 708, 710, and gap 712. Structure 704 includes layer 716, which has been treated using a hydrogen-containing gas as described herein.

As illustrated in FIG. 7, when a hydrogen gas ($H_2$) is provided, a film growth rate is improved by about two times from 0.24 Å/min to 0.43 Å/min and a step coverage is also improved from 93% to 113% on patterned structures 702, 704, respectively. Thus, FIG. 7 demonstrates that a hydrogen-containing gas provides film-forming promotion sites to the surface of silicon nitride films and contributes to increase of a film growth rate and improvement of step coverage property on a patterned structure.

Figure 8:
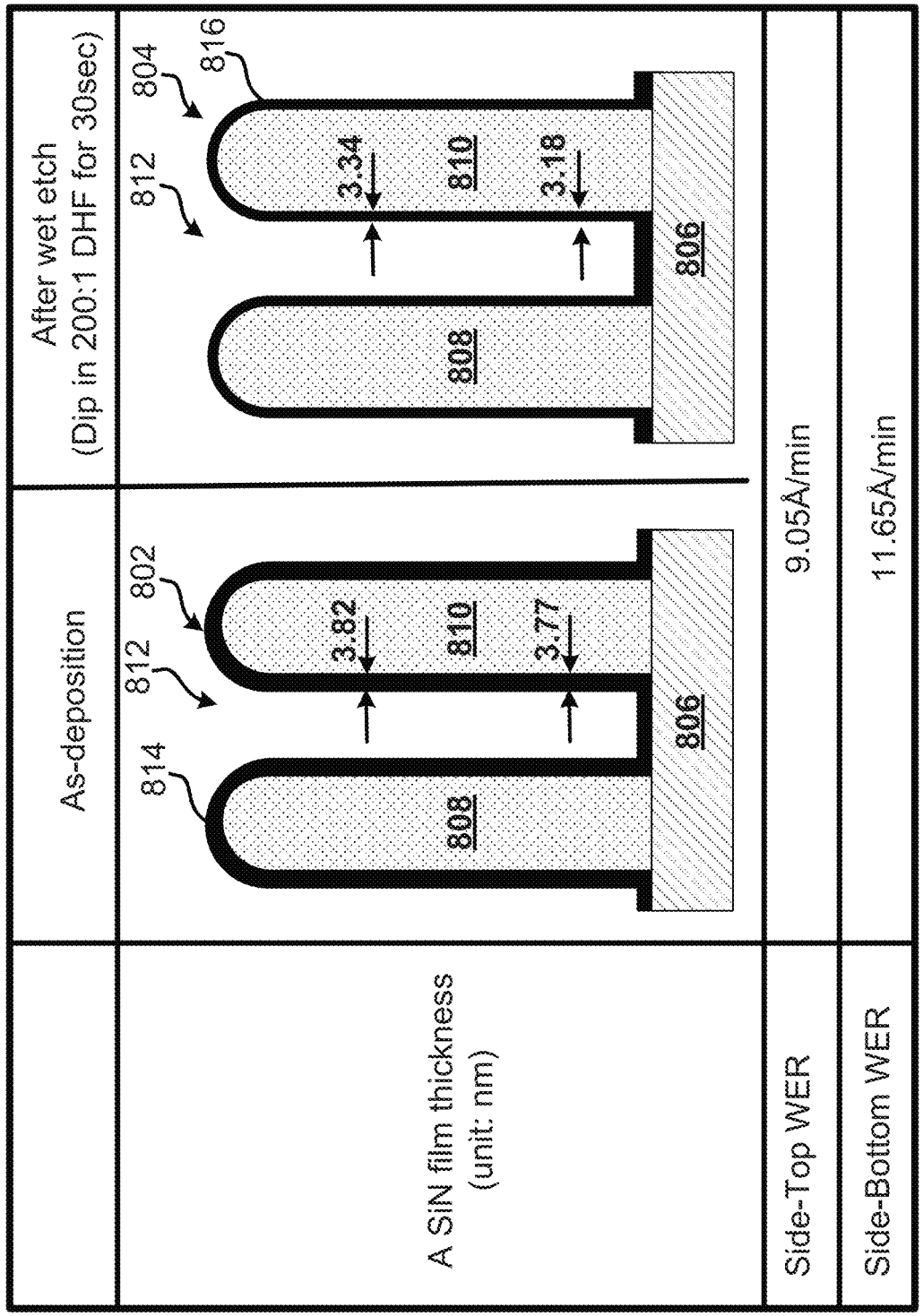
FIG. 8 illustrates conformal wet etch of films deposited using the method illustrated in FIG. 3.

FIG. 8 illustrates structures 802 and 804 and illustrates a wet etch rate uniformity. Structures 802 and 804 each include a substrate 806, features 808, 810, and a gap 812 formed therebetween. Structure 802 includes a conformally formed silicon nitride film 814 overlying features 808, 810, and gap 812. Structure 804 includes layer 816, which has been etched using a dilute hydrofluoric acid (200:1 water: HF) for 30 seconds.

As illustrated in FIG. 8, silicon nitride film 814 is conformally and uniformly formed on the patterned structure from the top to the bottom side of gap 812. A wet etch rate of the silicon nitride film from the side-top portion to the side-bottom portion is also uniform, e.g., 9.05 Å/min vs. 11.65 Å/min. The wet etch rate of the silicon nitride film in the side-bottom portion is particularly improved to 11.65 Å/min from 92.0 Å/min of the conventional process in which silicon nitride film is formed only by single RF power step.

Table 1 below shows a RF power and RF frequency condition of each plasma step of FIG. 4 according to one embodiment.

TABLE 1

RF power and RF frequency conditions

|  | First plasma condition (t3) | Second plasma condition (t4) | Third plasma condition (t5) |
| --- | --- | --- | --- |
| RF power | low | high | middle |
| RF frequency | high | high | high |

In first plasma condition of Table 1, low plasma power with high RF frequency may be provided to a reaction chamber to reduce an electric field at an edge region of the substrate for uniform film thickness over the substrate.

In second plasma condition, high plasma power with high RF frequency may be provided. High plasma power with high RF frequency may increase the density of ion density, increase a number of Si—N bonds and improve a film quality, e.g., lower and/or more uniform wet etch rate. In another embodiment, plasma power with dual (e.g., RF) frequency of high and low frequency may be provided to provide more ions to the bottom portion of the patterned structure; thus, a uniform film quality may be achieved even in complex patterned structures. In another embodiment, the plasma power may be provided in pulses (e.g., at a duty ratio of about 10% to about 90%) to provide more ions to the bottom portion of the patterned structure.

In the third plasma condition, middle plasma power with high RF frequency and activated hydrogen may be provided to form hydrogen-terminated sites uniformly on, for example, a deposited silicon nitride film from the top to the bottom portion of a patterned structure. High plasma power may increase ion density, but damage the film and hydrogen-terminated sites. Thus, middle-level plasma power may be provided to preserve hydrogen-terminated sites in the third plasma step. In Table 1, the plasma power frequency may be 13.56 MHz, or may be 27.12 MHz, or may be 60 MHz.

Table 2 provides a comparison of film properties according to the disclosure and a conventional method.

TABLE 2

A comparison of film properties according to the disclosure and the conventional method

| Method | | Film thickness uniformity (%) | Step coverage | Wet etch rate on side wall |
| --- | --- | --- | --- | --- |
| This disclosure (three RF steps) | | Good | Good | Good |
| Conventional method (single RF step) | Low RF power plasma | Good | Poor | Poor |
| | High RF power plasma | Poor | Poor | Good |
| | N$_2$/H$_2$ plasma | Good | Good | Poor |

In Table 2, a process according to the disclosure results in films with good film properties, including film thickness uniformity, step coverage and wet etch rate on side wall of patterned structure at the same time. In contrast, the conventional methods, which use a single RF power step, do not achieve good film properties in film thickness uniformity, step coverage and wet etch rate on side wall of patterned structure at the same time. Thus, the methods described herein include a technical advantage of achieving good film properties in film thickness uniformity, step coverage and wet etch rate on side wall of patterned structure at the same time.

Table 3 provides exemplary process conditions and ranges of an embodiment according to the disclosure—e.g., suitable for use with method 300 in FIG. 3 and/or timing sequence 400 in FIG. 4. The conditions of Table 3 can be used to form silicon nitride films.

TABLE 3

Exemplary conditions of an embodiment according to the disclosure

| Temperature (° C.) | | 50 to 550° C. (preferably 100 to 500° C.) |
| --- | --- | --- |
| Process pressure (Torr) | | 2 to 40 Torr (preferably 10 to 30 Torr) |
| Electrode gap (mm) | | 5 to 20 mm (preferably 7 to 15 mm) |
| First gas (silicon-containing precursor) | | Silane or halogen element-containing silicon source or other silicon-containing precursor |
| Reactant | | N$_2$ or other nitrogen-containing reactant |
| Film-forming promotion gas | | H$_2$ or other hydrogen-containing reactant |
| Gas flow rate (sccm) | N$_2$ (precursor carrier/purge gas) | 500 to 2,000 (preferably 1,000 to 1,500) |
| | N$_2$ (reactant) | 1,000 to 10,000 (preferably 3,000 to 8,000) |
| | H$_2$ | 1 to 30 (preferably 2 to 20) |
| Process time per step (sec) | Precursor feeding step | 0.05 to 3.0 (preferably 0.5 to 1.2) |
| | Precursor purge step | 0.2 to 5.0 (preferably 0.5 to 1.2) |
| | First plasma condition (t3) | 0.2 to 5.0 (preferably 0.5 to 2.0) |
| | Second plasma condition (t4) | 3.0 to 20.0 (preferably 8.0 to 15.0) |
| | Third plasma condition (t5) | 0.2 to 5.0 (preferably 0.5 to 2.0) |
| | Plasma purge (t6) | 0.0 to 1.0 (preferably 0.1 to 0.8) |
| Plasma power and frequency | First plasma condition (t3) | RF power: 100 to 800 W (preferably 300 to 600 W) RF frequency: 13.56 MHz |
| | Second plasma condition (t4) | RF power: 600 to 1,500 W (preferably 800 to 1,200 W) RF frequency: 13.56 MHz |
| | Third plasma condition (t5) | RF power: 300 to 1,000 W (preferably 500 to 800 W) RF frequency: 13.56 MHz |

Figure 9:
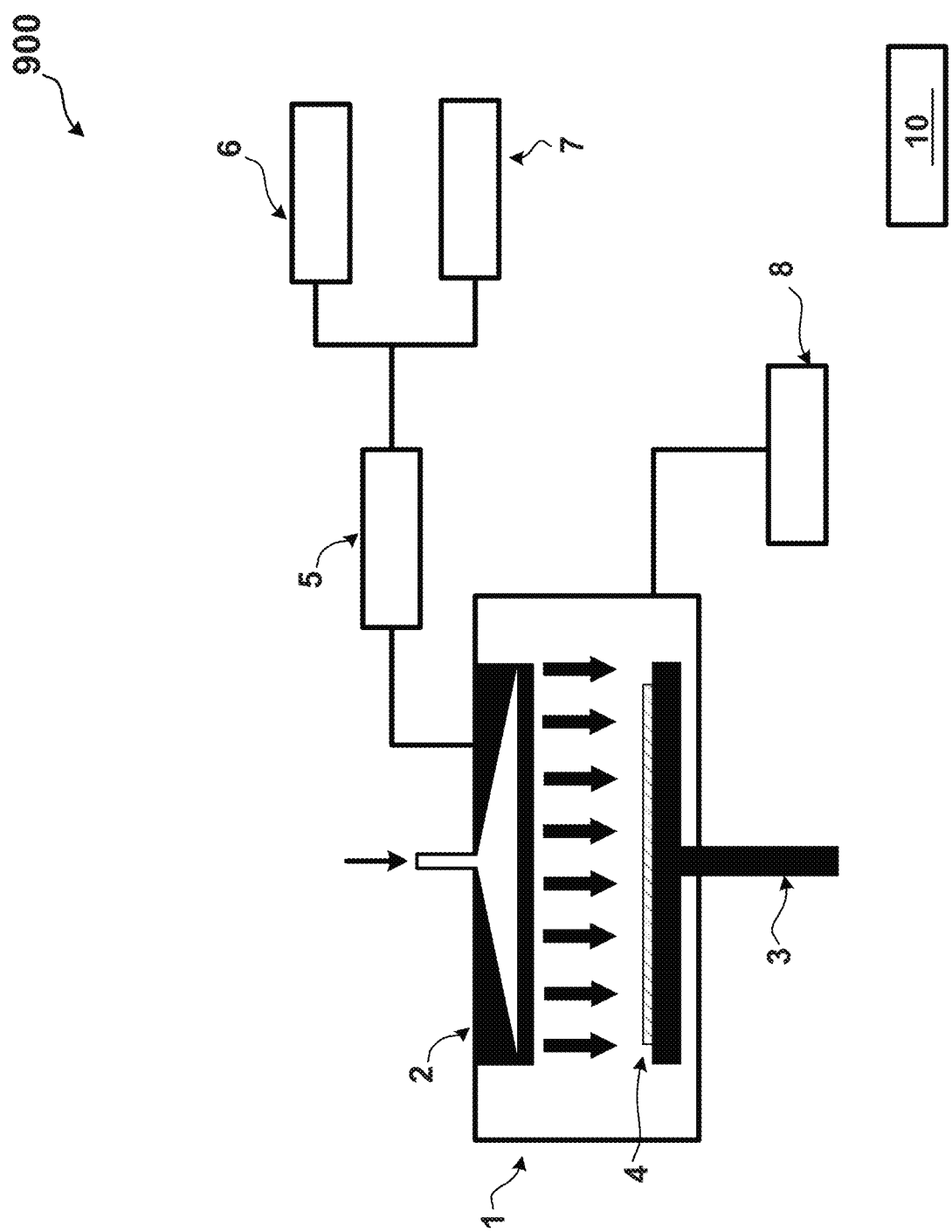
FIG. 9 illustrates a system in accordance with at least one embodiment of the disclosure.

FIG. 9 is a schematic illustration of a substrate processing apparatus or system 900 for implementing a process in accordance with the disclosure. In FIG. 9, a substrate 4 may be disposed on a substrate support 3 within a reactor 1. A gas supply unit 2 is configured to supply a gas to the substrate 4. The substrate support 3 may comprise a heating block supplying a heat energy to the substrate 4. The gas supply unit 2 may be a showerhead.

The process gas is exhausted through an exhaust unit 8, which may be an exhaust pump. The gas supply unit 2 can be or include an electrode that is connected to a plasma (e.g., RF) power supply unit. The RF power supply unit may comprise: a matching network 5, a high frequency RF power generator 6, and/or a low frequency RF power generator 7. The RF power may be provided to the reactor and the intensity of RF power according to the disclosure may be controlled by step by programmable control unit, such as a controller 10, which can be or include a computer.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of conformally forming a film on a substrate, the method comprising:
loading a substrate within a reaction chamber of a reactor;
providing a first gas comprising a carrier gas within the reaction chamber for a first gas pulse period;
providing a second gas consisting of the carrier gas and a nitrogen-containing reactant within the reaction chamber;
using a first plasma condition, forming first activated species using the second gas to thereby form a layer of deposited material;
forming a treated layer using a second plasma condition to form second activated species using the second gas to treat the deposited material; and
using a third plasma condition, forming activated species using a third gas to thereby form a surface-modified layer,
wherein forming the treated layer consists essentially of forming the second activated species using the second gas,
wherein the first plasma condition and the second plasma condition differ,
wherein the third gas consists of the carrier gas and the nitrogen-containing reactant and a hydrogen-containing reactant,
wherein the first plasma condition is carried out at a first plasma power, wherein the second plasma condition is carried out at a second plasma power, wherein the third plasma condition is carried out at a third plasma power, wherein the second plasma power is greater than the first plasma power, and wherein the third plasma power is greater than the first plasma power and less than the second plasma power.

2. The method according to claim 1, wherein the third plasma power is between 500 W and 800 W, the second plasma power is between 800 W and 1200 W, and the first plasma power is between 300 W and 600 W.

3. The method according to claim 1, wherein the second plasma power is between about 600 and about 1,500 W.

4. The method according to claim 1, wherein the third plasma power is between about 300 and about 1,000 W.

5. The method according to claim 1, wherein the layer of deposited material comprises silicon nitride and wherein the first gas does not comprise the hydrogen-containing reactant.

6. The method according to claim 1, wherein a step coverage of the film is greater than 80%.

7. The method according to claim 6, wherein the first plasma power is between about 100 and about 800 W.

8. The method according to claim 1, further comprising repeating the steps of:
providing the first gas within the reaction chamber;
using the first plasma condition, forming first activated species using the second gas to thereby form another layer of deposited material;
using the second plasma condition, forming second activated species using the second gas; and
using the third plasma condition, forming activated species using a third gas to thereby form another surface-modified layer.

9. The method according to claim 1, wherein the first plasma condition exhibits a reduced electric field at an edge of a substrate relative to an electric field formed at the edge using the second plasma condition.

10. The method according to claim 1, wherein the second plasma condition increases a hardness of the layer of deposited material.

11. The method according to claim 1, wherein the third plasma condition creates film-forming promotion sites on the treated layer.

12. The method according to claim 1, wherein the first gas comprises a silicon-containing precursor.

13. The method according to claim 12, wherein the silicon-containing precursor comprises a silane precursor.

14. The method according to claim 12, wherein the silicon-containing precursor comprises a halogen.

15. The method according to claim 12, wherein the silicon-containing precursor comprises an amine.

16. The method according to claim 12, wherein the silicon-containing precursor comprises at least one of trisilylamine $(SiH_3)_3N$); disilane $(SiH_3)_2$); disilylmethylamine $(SiH_3)_2NMe$); disilylethylamine $(SiH_3)_2NEt$); disilylisopropylamine $(SiH_3)_2N(iPr)$; disilyl-tert-butylamine $((SiH_3)_2N(tBu))$; diethylsilylamine $(SiH_3NEt_2)$; di-tert-butylsilylamine $(SiH_3N (tBu)_2)$; bis-diethylamino-silane $(SiH_2(NEt_2)_2)$; bis-dimethylamino-silane $(SiH_2 (NMe_2)_2)$; bis-tertiarybutylamino-silane $(SiH_2 (NHtBu)_2)$; tetraethylorthosilicate $(Si (OEt)_4)$; silicon tetrachloride $(SiCl_4)$; hexachlorodisilane $(Si_2Cl_6)$; dichlorosilane $(SiH_2Cl_2)$; tris-dimethylamino-silane $(SiH(N(Me)_2)_3)$; bis-ethylmethylamino-silane $(SiH_2[N(Et) (Me)]_2)$; hexakis-ethylamino-disilane $(Si_2 (NHEt)_6)$; tetrakis-ethylamino-silane $(Si(NHEt)_4)$; trisilane $(Si_3H_8)$; or any combination thereof, wherein Me represents a methyl group, Et represents an ethyl group, iPr represents an isopropyl group, and tBu represents a tert-butyl group.

17. A method of conformally forming a film on a substrate, the method comprising:
loading a substrate within a reaction chamber of a reactor;
providing a first gas comprising a carrier gas within the reaction chamber for a first gas pulse period;

providing a second gas consisting of the carrier gas and a nitrogen-containing reactant within the reaction chamber;

using a first plasma condition, forming first activated species using the second gas to thereby form a layer of deposited material;

forming a treated layer using a second plasma condition to form second activated species using the second gas to treat the deposited material; and using a third plasma condition, forming activated species using a third gas to thereby form a surface-modified layer, wherein forming the treated layer consists essentially of forming the second activated species using the second gas, wherein the first plasma condition and the second plasma condition differ, wherein the third gas consists of the carrier gas and the nitrogen-containing reactant and a hydrogen-containing reactant, and wherein the second plasma condition decreases a wet etch rate nonuniformity of the layer of deposited material.

18. A method of conformally forming a film on a substrate, the method comprising:

loading a substrate within a reaction chamber of a reactor;

providing a first gas comprising a carrier gas within the reaction chamber for a first gas pulse period;

providing a second gas consisting of the carrier gas and a nitrogen-containing reactant within the reaction chamber;

using a first plasma condition, forming first activated species using the second gas to thereby form a layer of deposited material;

forming a treated layer using a second plasma condition to form second activated species using the second gas to treat the deposited material; and using a third plasma condition, forming activated species using a third gas to thereby form a surface-modified layer, wherein forming the treated layer consists essentially of forming the second activated species using the second gas, wherein the first gas comprises a silicon-containing precursor, and wherein the nitrogen-containing reactant comprises one or more of $N_2O$ and $NO_2$, alone or in any combination.

19. A method of conformally forming a film on a substrate, the method comprising:

loading a substrate within a reaction chamber of a reactor;

providing a first gas comprising a carrier gas within the reaction chamber for a first gas pulse period;

providing a second gas consisting of the carrier gas and a nitrogen-containing reactant within the reaction chamber;

using a first plasma condition, forming first activated species using the second gas to thereby form a layer of deposited material;

forming a treated layer using a second plasma condition to form second activated species using the second gas to treat the deposited material; and using a third plasma condition, forming activated species using a third gas to thereby form a surface-modified layer, wherein forming the treated layer consists essentially of forming the second activated species using the second gas, wherein the first plasma condition and the second plasma condition differ, wherein the third gas consists of the carrier gas and the nitrogen-containing reactant and a hydrogen-containing reactant, and wherein the second gas is continuously provided during the steps of providing the first gas, providing the second gas, and using the third gas.

20. A method of conformally forming a film on a substrate, the method comprising:

loading a substrate within a reaction chamber of a reactor;

providing a first gas comprising a carrier gas within the reaction chamber for a first gas pulse period;

providing a second gas consisting of the carrier gas and a nitrogen-containing reactant within the reaction chamber;

using a first plasma condition, forming first activated species using the second gas to thereby form a layer of deposited material;

forming a treated layer using a second plasma condition to form second activated species using the second gas to treat the deposited material; and using a third plasma condition, forming activated species using a third gas to thereby form a surface-modified layer, wherein forming the treated layer consists essentially of forming the second activated species using the second gas, wherein the first plasma condition and the second plasma condition differ, wherein the third gas consists of the carrier gas and the nitrogen-containing reactant and a hydrogen-containing reactant, and wherein an electrode spacing during the step of forming first activated species differs from an electrode spacing during the step of forming second activated species.

21. The method according to claim 1, wherein the substrate is heated to a temperature between 100° C. and 500° C.

* * * * *